(12) United States Patent
Daskalakis et al.

(10) Patent No.: US 6,381,148 B1
(45) Date of Patent: Apr. 30, 2002

(54) DUAL PROCESSOR RETENTION ASSEMBLY

(75) Inventors: George Daskalakis, Forest Grove; Conal O'Neill, Portland, both of OR (US); James Roecker, Dupont, WA (US)

(73) Assignee: Intel, Corp., Santa Clara, CA (US)

( * ) Notice: Subject to any disclaimer, the term of this patent is extended or adjusted under 35 U.S.C. 154(b) by 0 days.

(21) Appl. No.: 09/207,627

(22) Filed: Dec. 9, 1998

(51) Int. Cl.[7] ................................................. H05K 7/14
(52) U.S. Cl. ...................... 361/801; 361/802; 361/725; 361/754; 361/759; 211/41.17; 439/76.1; 439/327
(58) Field of Search ................................. 361/723–725, 361/728–730, 754, 756, 759, 796, 801, 802; 439/76.1, 62, 260, 325–328

(56) References Cited

U.S. PATENT DOCUMENTS

| | | | | | |
|---|---|---|---|---|---|
| 3,328,646 A | * | 6/1967 | Caillat | ......................... | 317/101 |
| 3,662,224 A | * | 5/1972 | Rauch | ......................... | 361/741 |
| 4,740,164 A | * | 4/1988 | Schulz et al. | .................. | 439/64 |
| 4,914,552 A | * | 4/1990 | Kecmer | ....................... | 361/415 |
| 4,947,289 A | * | 8/1990 | Dynie | ......................... | 361/801 |
| 5,003,431 A | * | 3/1991 | Insdahl | ......................... | 361/415 |
| 5,592,366 A | * | 1/1997 | Goldman et al. | ............ | 361/796 |
| 5,642,263 A | * | 6/1997 | Lauruhn | ...................... | 361/801 |
| 5,726,865 A | * | 3/1998 | Webb et al. | ................. | 361/801 |
| 5,829,601 A | * | 11/1998 | Yurchenco et al. | ....... | 211/41.17 |
| 5,991,837 A | * | 11/1999 | Cronin et al. | ................ | 710/100 |
| 6,155,433 A | * | 12/2000 | Anderson et al. | .............. | 211/26 |
| 6,310,779 B1 | * | 10/2001 | Wang | .......................... | 361/760 |

* cited by examiner

Primary Examiner—Jeffrey Gaffin
Assistant Examiner—Tuan Dinh
(74) Attorney, Agent, or Firm—Kenyon & Kenyon

(57) ABSTRACT

A processor retention assembly is disclosed. An embodiment of the processor retention assembly includes a first dual processor retention module and a second dual processor retention module. A connecting member is attached to the first dual processor retention module at a first end and is attached to the second dual processor retention module at a second end. In accordance with another embodiment of the present invention, covers are hingedly attached to each of the first and second dual processor retention modules.

33 Claims, 11 Drawing Sheets

DUAL PROCESSOR RETENTION ASSEMBLY

BACKGROUND OF THE INVENTION

The present invention relates to a processor retention assembly. More specifically, the invention provides for retaining a dual processor assembly in a computer chassis.

The mounting of a dual processor assembly in a computer chassis presents challenges. As the processors become faster in their ability to process information, they can also tend to become larger and hotter. Therefore, due to the larger physical size of the processor itself and the heat sink associated with the processor, the mounting of the processor assembly within the computer chassis can present problems. The mounting assembly should be comprised of a rugged structure that is sturdy enough to be able to support the processors such that the processors are not adversely affected by the shock and vibration forces that may be applied to the mounting assembly. However, the mounting assembly should also provide for ease of installation and removal of the processor assembly from the mounting assembly. Additionally, the mounting assembly should be able to be secured to the computer chassis without requiring an extensive amount of connection hardware.

All of these potentially competing design factors can result in an inefficient solution for mounting a dual processor assembly within a computer chassis. Prior solutions suffer drawbacks in one or more of the design considerations of strength, ease of installation/removal, and quantity of connection hardware. Therefore, it would be desirable to provide for an improved apparatus and method for mounting a dual processor assembly within a computer chassis.

SUMMARY OF THE INVENTION

A processor retention assembly is provided. An embodiment of the processor retention assembly includes a first dual processor retention module and a second dual processor retention module. A connecting member is attached to the first dual processor retention module at a first end and is attached to the second dual processor retention module at a second end. In accordance with another embodiment of the present invention, covers are hingedly attached to each of the first and second dual processor retention modules.

DETAILED DESCRIPTION

Figure 1:
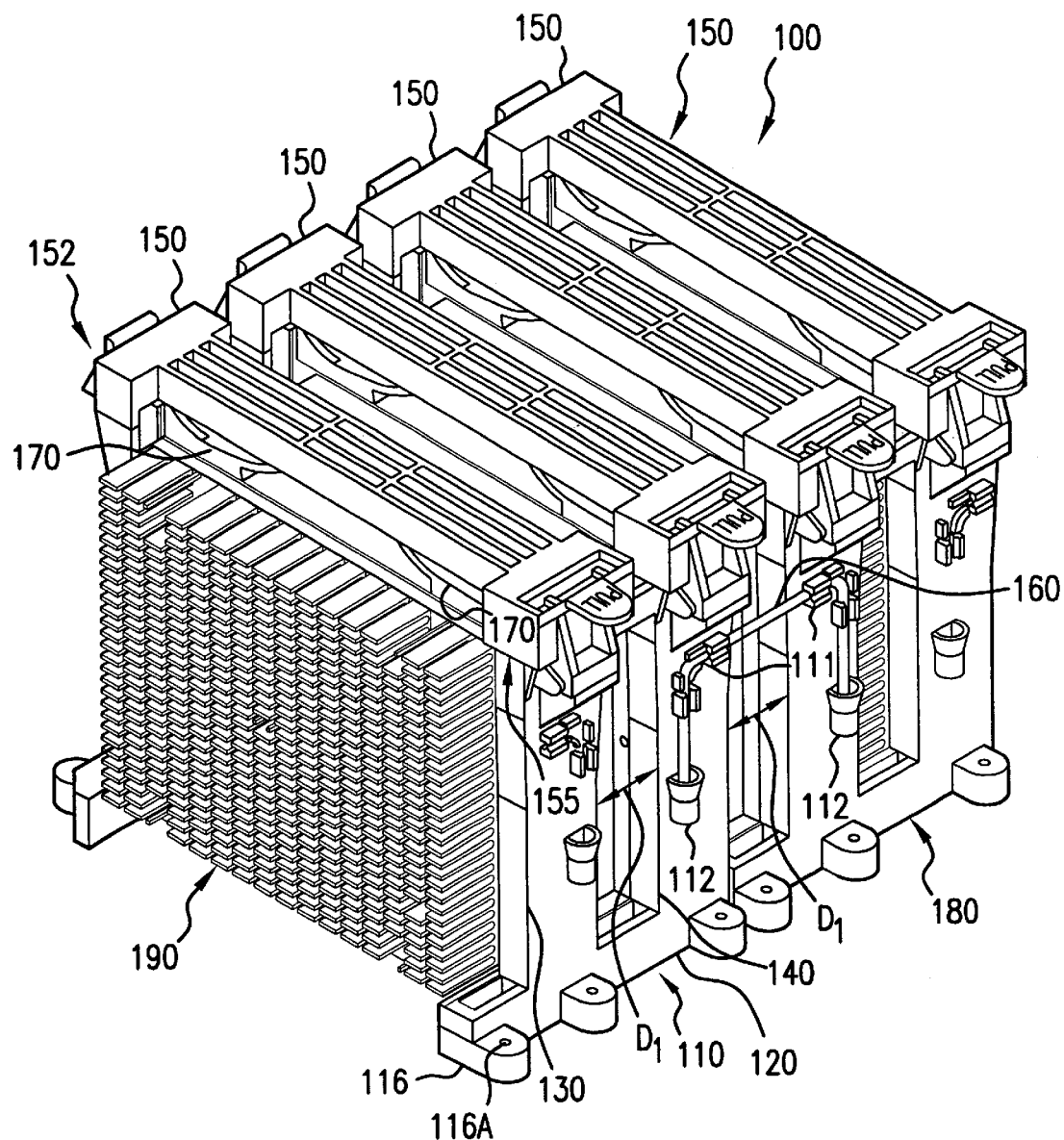
FIG. 1 illustrates an embodiment for the processor retention assembly of the present invention.

FIG. 1 illustrates an embodiment for the processor retention assembly 100 of the present invention. As can be seen in FIG. 1, processor retention assembly 100 includes a first dual processor retention module 110 and a second dual processor retention module 180. Whereas the embodiment of FIG. 1 illustrates two dual processor retention modules connected together, the present invention is not limited to only including two dual processor retention modules. The present invention may be practiced by utilizing a single dual processor retention module or could include multiple dual processor retention modules connected together depending upon the requirements of the system with which the processor retention assembly 100 is utilized. Each dual processor retention module contains within it two processor cards 190. As will be further explained later in this specification, the dual processor retention modules support and retain the processor cards within them. Since each dual processor retention module is similarly constructed, a detailed description will only be provided for dual processor retention module 110.

Dual processor retention module 110 includes a base portion 120 and first and second brackets 130, 140, respectively, which extend perpendicularly from base portion 120. Base portion 120 includes securement tabs 116 which define apertures 116A therethrough. Securement tabs 116 are provided for receiving connecting hardware through them for connecting dual processor retention module 110 to structure provided on the computer chassis. When dual processor retention module 110 is secured to a computer chassis (not shown), the connecting hardware would extend through securement tabs 116, through a motherboard (not shown), and into structure provided on the computer chassis. Therefore, the connecting hardware would be utilized to connect dual processor retention module 110 onto a motherboard. Whereas three securement tabs 116 are provided on each end of dual processor retention module 110 (not all are visible in FIG. 1), it is not required that connecting hardware be utilized in each securement tab 116. For example, if only one dual processor retention module 110 was utilized, it may be possible to only utilize connecting hardware through two securement tabes 116, one on each side of dual processor retention module 110. Similarly, if two dual processor retention modules were utilized, as illustrated in FIG. 1, it may be possible that only two pieces of connecting hardware be utilized on each side of processor retention assembly 100. For example, a single piece of connecting hardware may be utilized tat each end of dual processor retention module 110 and a single piece of connecting hardware may be utilized at each end of second dual processor retention module 180 such that only four pieces of connecting hardware, used at each corner of processor retention assembly 100, are utilized to secure processor retention assembly 100 to the computer chassis. As will be further explained later in this specification, connecting member 160 is utilized to connect dual processor retention module 110 to second dual processor retention module 180.

As will also be further explained later in this specification, each processor card 190 contains on it two cam levers 170 which cooperate with the brackets of the dual processor retention module to secure the processor card 190 within the dual processor retention module. Also illustrated in FIG. 1 are covers 150. Each bracket of each dual processor retention module includes a cover 150. Cover 150 includes a hinged end 152 and a securement end 155. Hinged end 152 provides for hingedly attaching cover 150 to its respective bracket and securement end 155 provides for releasable securing cover 150 to its respective bracket.

As was previously mentioned above, connecting member 160 connects first dual processor retention module 110 to second dual processor retention module 180. Each bracket of the dual processor retention module includes on it retention tabs 111 and a retention receptacle 112 that receive within them connecting member 160. The present invention is not limited to only connecting first dual processor retention module 110 to second dual processor retention module 180 by utilizing the structure illustrated in FIG. 1. There may be many other embodiments possible for connecting member 160 and the retention structure associated with the brackets of the dual processor retention modules that receive within them connecting member 160. Connecting member 160 does not provide for any electrical connection between first dual processor retention module 110 and second dual processor retention module 180. Connecting member 160 only provides for physical connection between the two dual processor retention modules. When first dual processor retention module 110 is connected to second dual processor retention module 180, a distance of approximately two inches separates each bracket of each dual processor retention module. The separation distance $D_1$ of two inches between each bracket is desired in order to provide clearance for each heat sink that is associated with each processor card contained within the brackets such that air flow may be provided across the heat sinks through processor retention assembly 100 in order to cool the processor cards.

Figure 2:
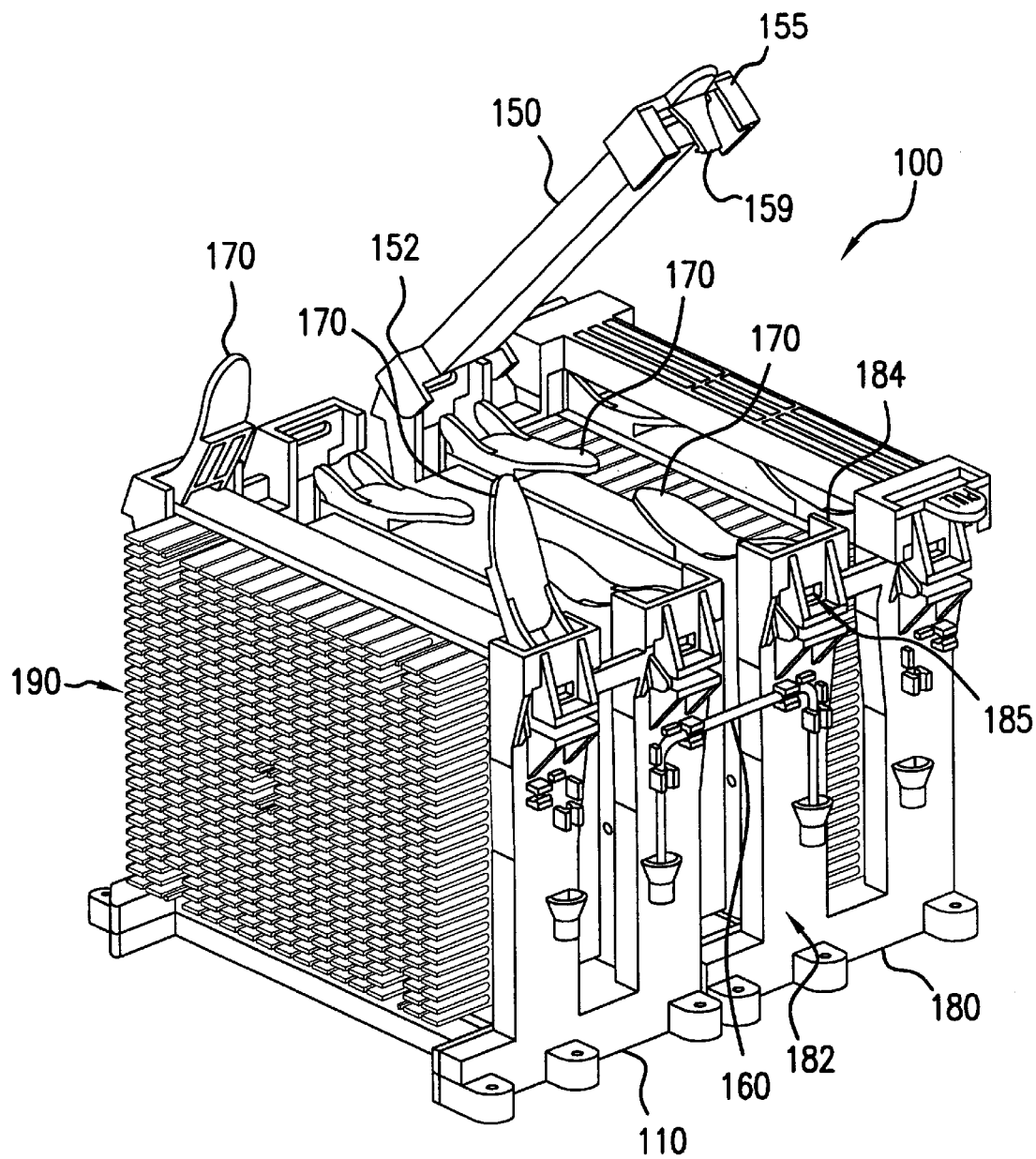
FIG. 2 illustrates the processor retention assembly of FIG. 1 with one of the covers in an open position.

FIG. 2 illustrates processor retention assembly 100 with one of the covers 150 in an open position with respect to its bracket and one of a set of cam levers 170 also open with respect to its bracket. For purposes of clarity, covers 150 are not shown on first dual processor retention module 110. As can be seen in FIG. 2, cover 150 has been opened on first bracket 182 of second dual processor retention module 180. Securement tab 159, included on securement end 155 of cover 150, has been disengaged from slot 185 of the cover receiving structure 184 that is included on first bracket 182 of dual processor retention module 180. Thus, in this disengaged position, cover 150 may be raised, or opened, by pivoting cover 150 at its hinged end 152. In this position for cover 150, the cam levers 170 that are associated with the processor card that is installed within first bracket 182 may be accessed in order to lock or unlock the processor card from first bracket 182.

As can be further seen in FIG. 2, and as was mentioned previously above, the cam levers 170 that are associated with one of the processor cards that are installed within first dual processor retention module 110 have been moved to an unlocked position with respect to the bracket. As will be further explained later in this specification, when the cam levers have been moved to this unlocked position, structure associated with cam levers 170 is disengaged from structure included on the bracket of first dual processor retention module 110. When cam levers 170 have been moved to this unlocked position, the processor card may be lifted up and out of dual processor retention module 110. When cam levers 170 have been moved down so that they lay in a parallel orientation with the top of the processor card, cam levers 170 lock the processor card within its respective bracket. A more detailed description of the cam levers will be provided when discussing FIGS. 6 and 7.

Figure 3:
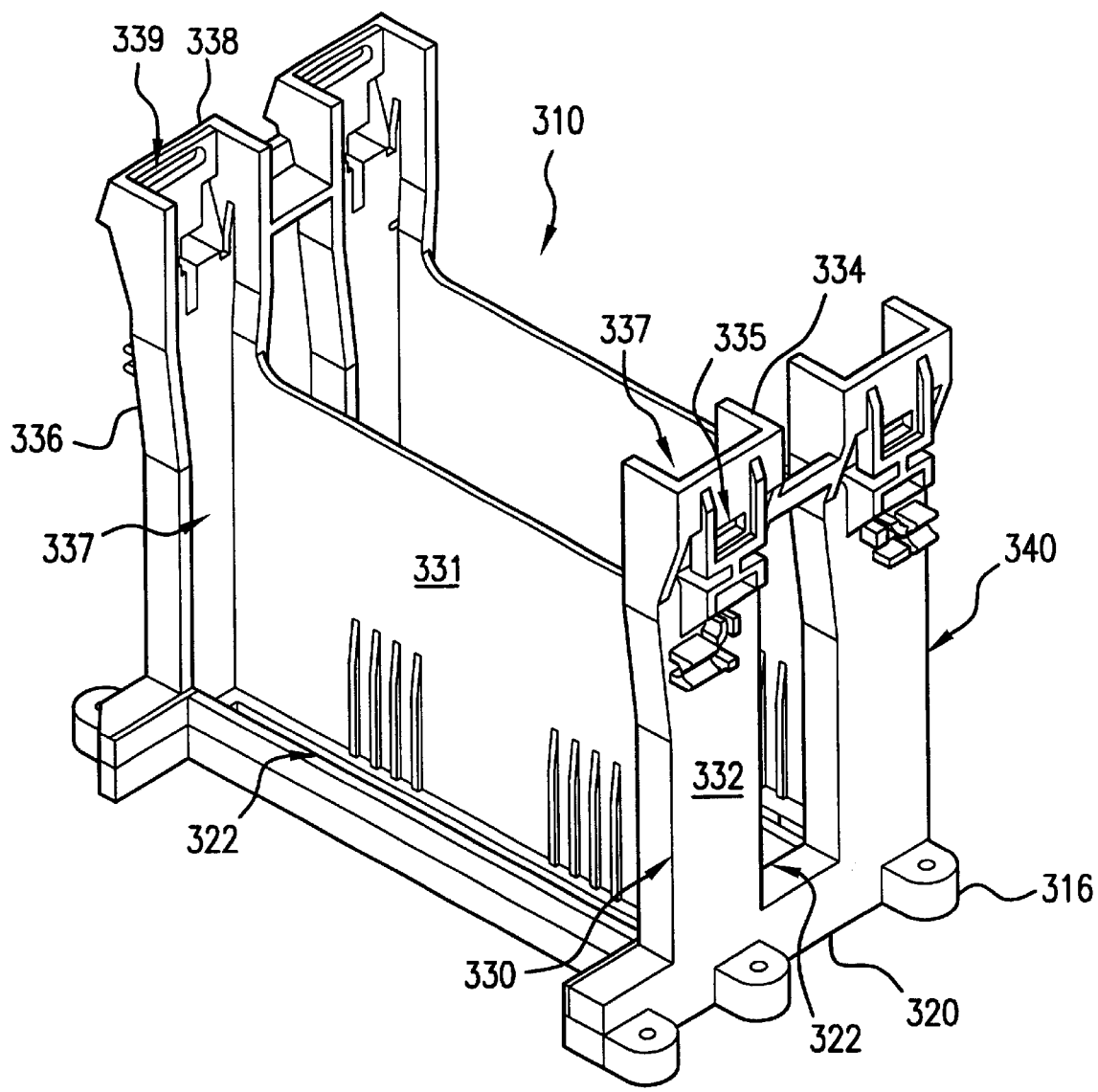
FIG. 3 illustrates an embodiment for a dual processor retention module in accordance with the present invention.

FIG. 3 provides an illustration for an embodiment of a dual processor retention module. As can be seen in FIG. 3, dual processor retention module 310 includes a base portion 320, a first bracket 330, and a second bracket 340, as was previously described when discussing FIG. 1. Base portion 320 defines two slots 322 through which extend electrical connectors that are included on the motherboard and to which the processor cards (not shown) connect when the processor cards are inserted into dual processor retention module 310. Thus, dual processor retention module 310 is placed on a motherboard such that the electrical connectors on the motherboard are positioned within base portion 320 in the slots 322 that are defined by base portion 320.

Since first bracket 330 is formed similarly to second bracket 340, a description will only be provided for first bracket 330. First bracket 330 comprises a first support structure 332 and an opposite second support structure 336. The two support structures 332, 336 receive within them the ends of the processor card that is inserted into first bracket 330. As such, each support structure 332, 336 defines a u-shaped groove 337 within it such that the ends of the processor card may be received within the support structures. A wall 331 extends between first support structure 332 and opposite, second support structure 336 on one side of first bracket 330. The other side of first bracket 330 is open such that the heat sink that is associated with the processor card that is inserted into first bracket 330 may extend outside of the bracket such that air flow may be provided over the heat sink to assist in cooling the processor card. At the top end of first support structure 332 is provided cover receiving structure 334. Cover receiving structure 334 defines cover slot 335, which receives within it securement tab 159 that is included on each cover 150 in order to lock cover 150 onto the bracket. At the top end of second support structure 336 is provided a cover hinge structure 338 that defines hinge slot 339. Hinge slot 339 receives within it hinged end 152 of cover 150 such that cover 150 may be pivoted on bracket 330 in order to open and lock cover 150 on bracket 330.

Figure 4:
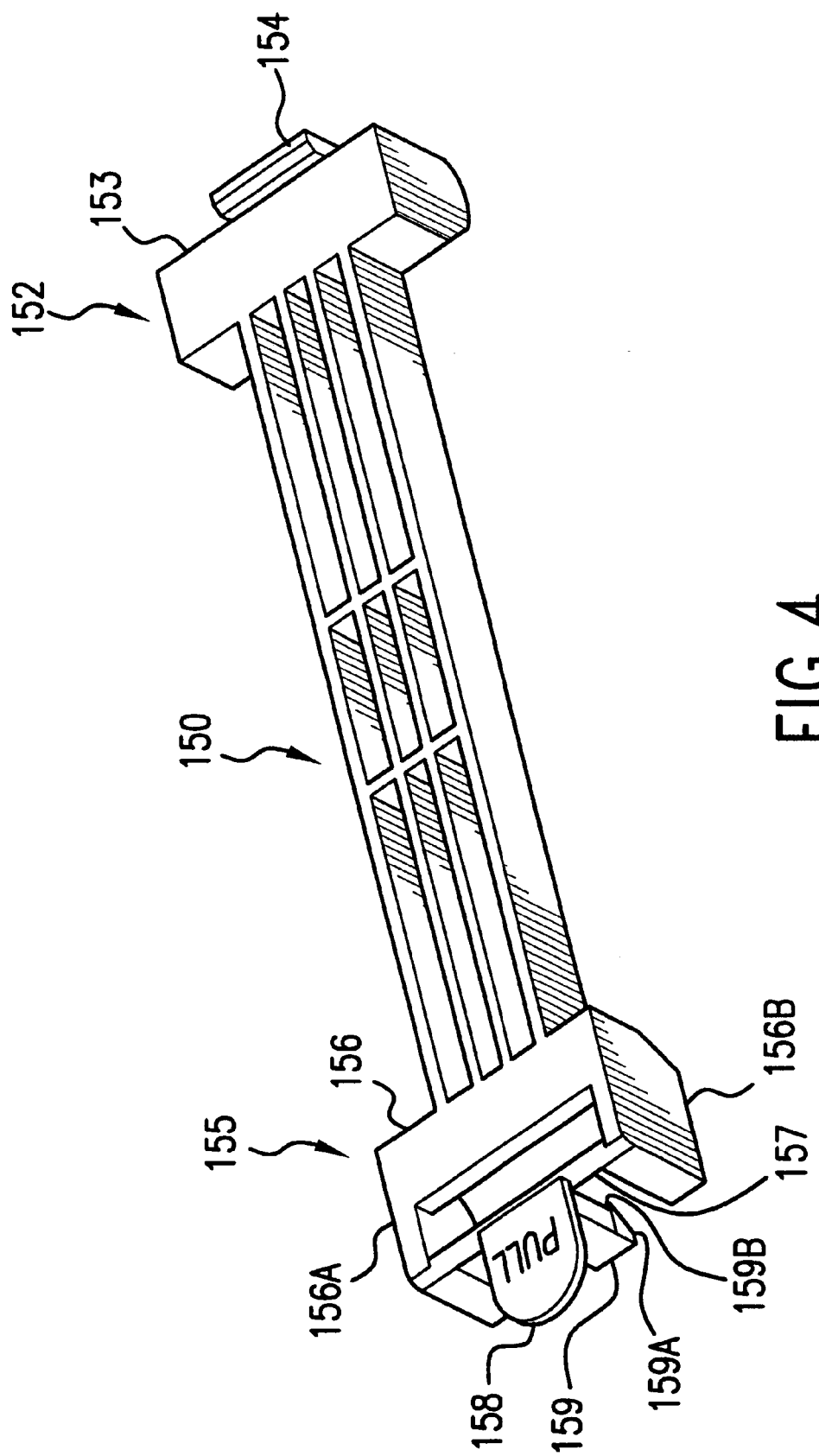
FIG. 4 is a top perspective view of an embodiment for a cover for a dual processor retention module.
Figure 5:
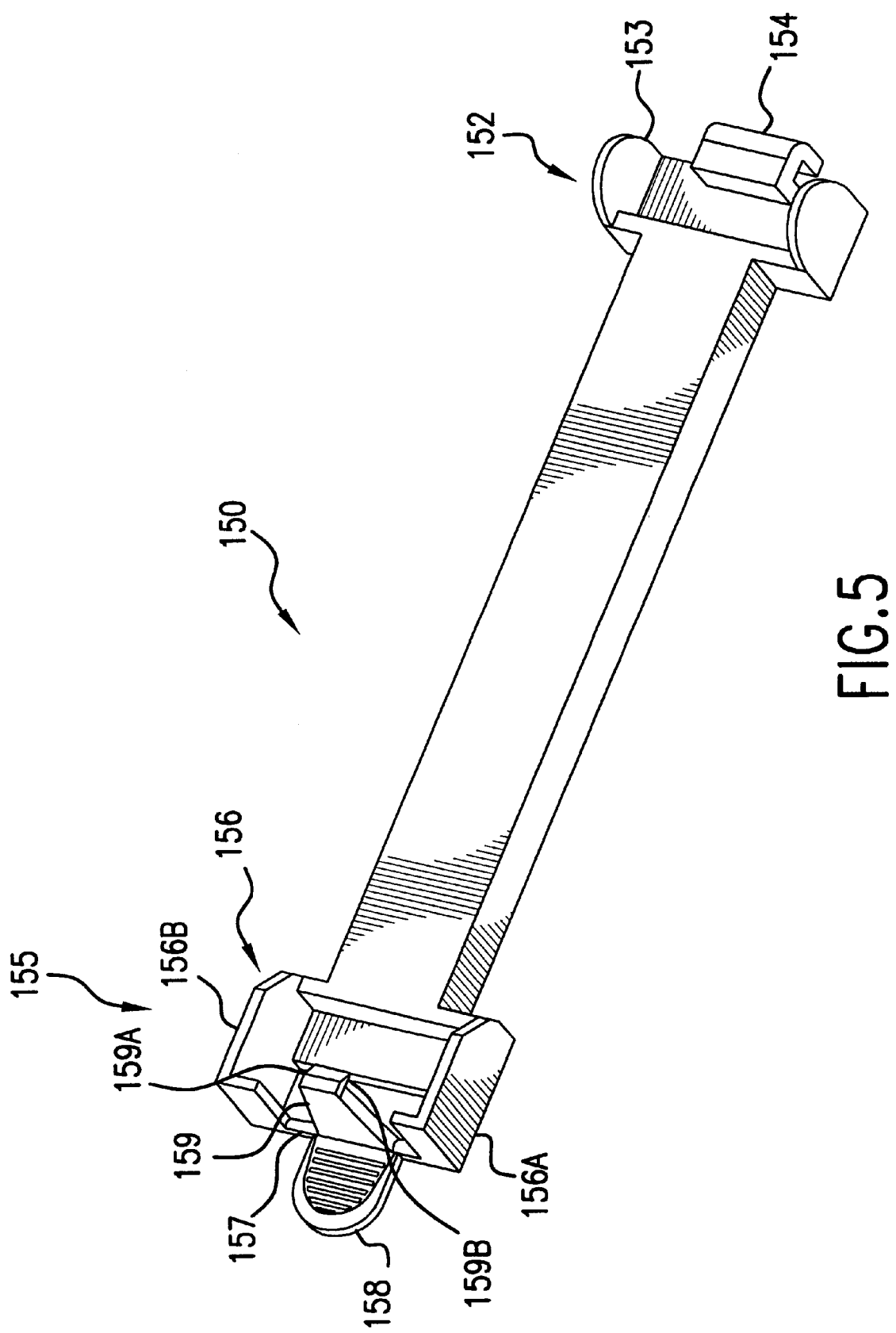
FIG. 5 is a bottom perspective view of the cover of FIG. 4.

FIGS. 4 and 5 illustrate one embodiment for cover 150. As was described previously, cover 150 includes hinged end 152 and securement end 155. Hinged end 152 and securement end 155 are included at opposite ends of cover 150. Hinged end 152 includes hinge structure 153 to which is attached hinge 154. As can be seen, hinge 154 is a u-shaped structure and is received within the hinge slot that is included in the brackets of the dual processor retention module, as described previously. Securement end 155 of cover 150 includes a securement structure 156. Securement structure 156 includes two arms 156A and 156B to which is attached shaft 157. Shaft 157 extends from first arm 156A to second arm 156B. Shaft 157 is attached to securement structure 156 in a semi-rigid configuration such that the shaft is able to rotate slightly when a user pulls up on pull tab 158 in order to disengage securement tab 159 from the cover slot that is defined in the bracket of the dual processor retention module. However, shaft 157 is attached to securement structure 156 such that, in the absence of a pulling force on pull tab 158, securement tab 159 remains securely within the cover slot in the bracket.

As can be seen in FIGS. 4 and 5, pull tab 158 extends from shaft 157 and securement tab 159 is associated with both the pull tab 158 and shaft 157. Securement tab 159 extends generally perpendicular with respect to pull tab 158. A camming surface 159A and an engagement portion 159B are provided on securement tab 159 such that securement tab 159 may cooperate with the cover receiving structure that is included on the brackets of the dual processor retention module such that securement tab 159 may engage the cover receiving structure and be disengaged from the cover receiving structure. The configuration of securement end 155 of cover 150 is particularly unique in that due to the design of shaft 157 and its association with securement structure 156, pull tab 158 and securement tab 159 are not structurally deformed by pulling-forces when the operator desires to disengage cover 150 from the bracket of the dual processor retention module. Rotation of shaft 157 provides for disengagement of securement tab 159 from the bracket.

Figure 6:
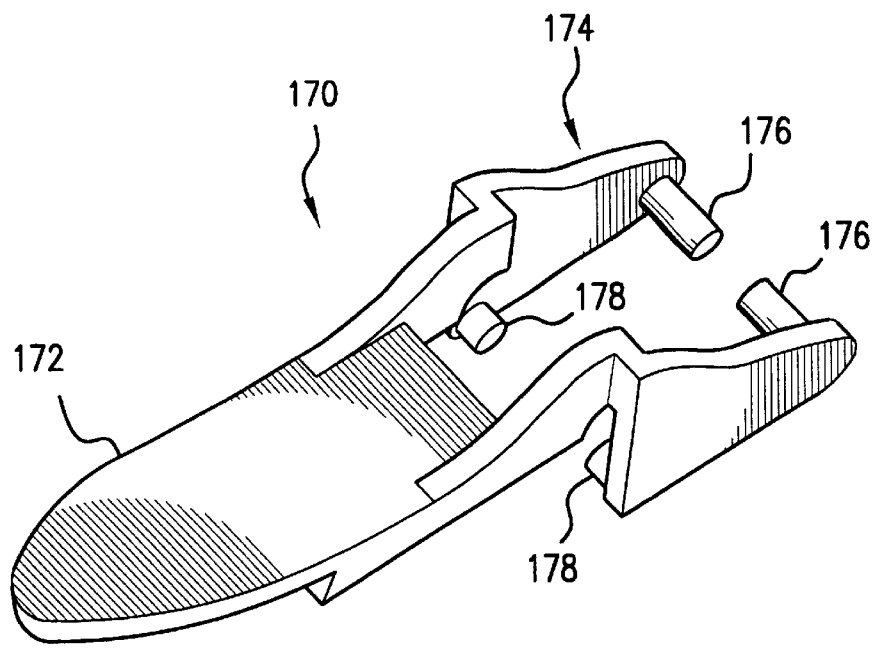
FIG. 6 is a top perspective view of an embodiment for a cam lever in accordance with the present invention.
Figure 7:
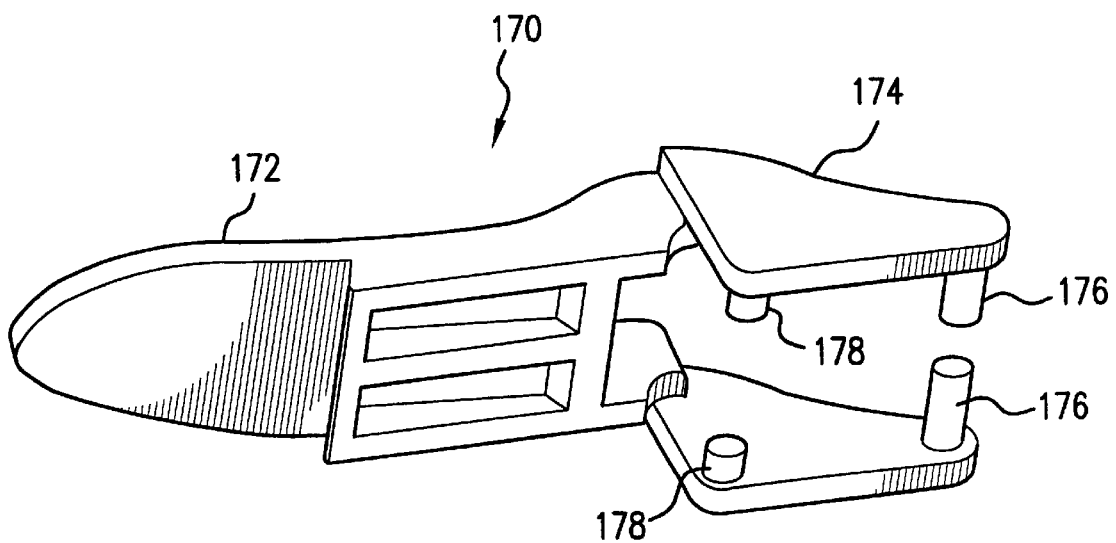
FIG. 7 is a bottom perspective view of the cam lever of FIG. 6.

FIGS. 6 and 7 illustrate one embodiment for cam levers 170. Each cam lever is similarly formed and, as can be seen, each cam lever 170 includes a grasping portion 172 and an engagement portion 174. Engagement portion 174 includes attachment tabs 178 that engage with structure included on the processor card such that cam lever 170 may be pivotally mounted on the processor card. Engagement portion 174 also includes engaging tabs 176 that cooperate with structure provided on the brackets of the dual processor retention module such that when the engaging tabs 176 engage the structure on the bracket the processor card is locked within the bracket and when the engaging tabs are not engaged with the brackets the processor card may be removed from the bracket.

When a processor card is inserted into a dual processor retention module, cam levers 170 that are associated with the processor card are pivoted such that they extend upward from the processor card, as illustrated in FIG. 2. As the processor card is inserted into the bracket of the processor retention module, engaging tabs 176 of cam lever 170 interact with structure on the bracket such that the engaging tabs are received within the bracket and, as the processor card is inserted further into the bracket, engaging tabs 176 are received within cam receiving slots that are included in the bracket. The receiving of engaging tabs 176 in the cam receiving slots of the bracket forces the cam lever into a position where the grasping portion 172 lies substantially parallel with the top of the processor card and thus, the cam lever 170 locks the processor card within the bracket. When a user wants to remove the processor card from the bracket, the user would grasp grasping portion 172 of each cam lever 170 and pull up on cam levers 170 such that engaging tabs 176 are pivoted such that they rotate out of the cam receiving slots in the bracket which in-turn forces the processor card up and out of the bracket. The user may then continue to lift the processor card up and out of the bracket for removal of the processor card from the processor retention module.

Figure 8:
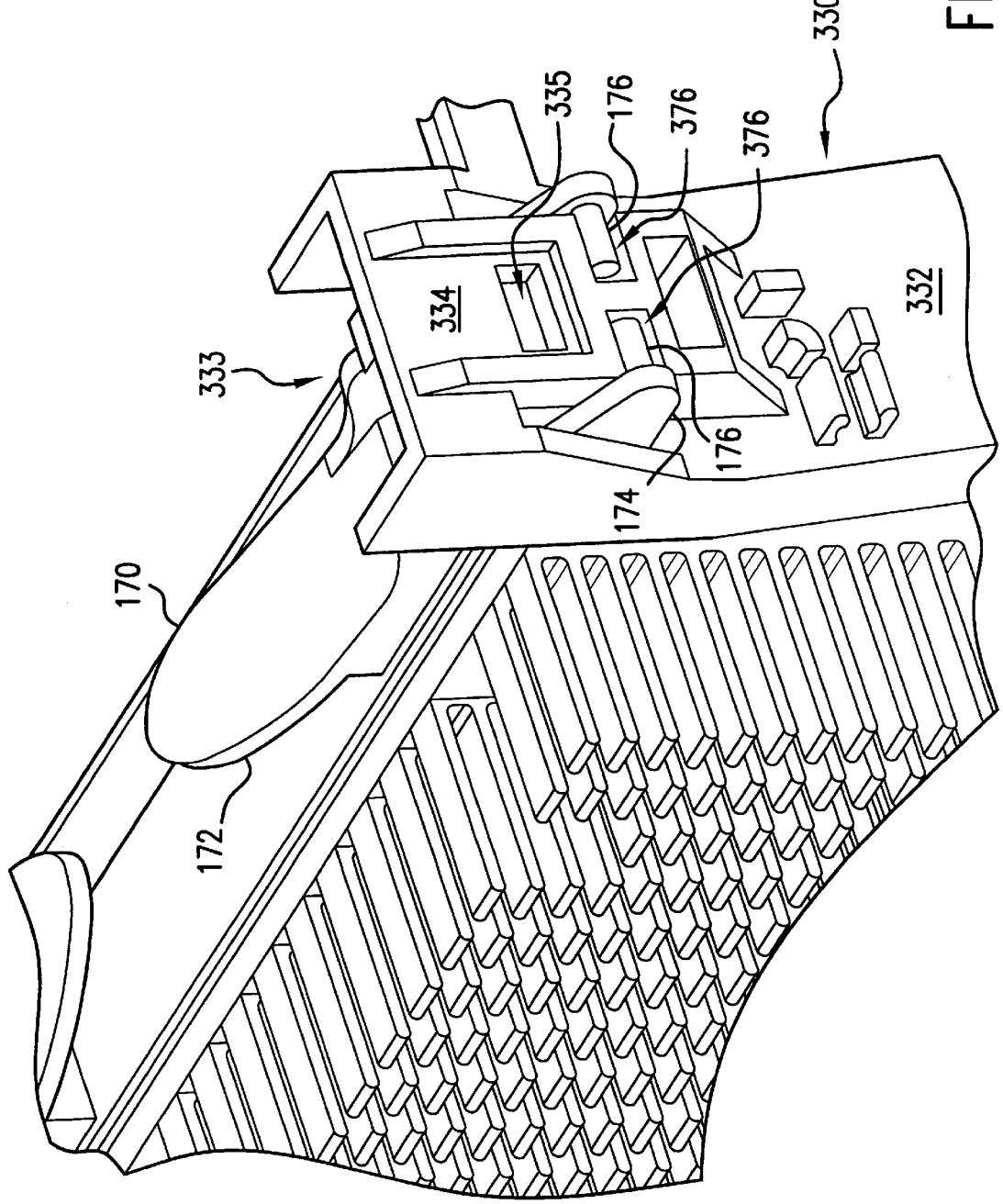
FIG. 8 illustrates an embodiment for a cam lever as it is received within an embodiment for a bracket of a dual processor retention module.

FIG. 8 illustrates the assembled configuration for cam lever 170 as it is received within cam receiving slots 376 that are included on first support structure 332 of first bracket 330, as was previously discussed in connection with FIG. 3. As can be seen in FIG. 8, cam lever 170 has locked the processor card within bracket 330. Engaging tabs 176 of cam lever 170 have been fully received within cam receiving slots 376 of first support structure 332 of bracket 330. With engaging tabs 176 fully received within cam receiving slots 376, the processor card is locked within bracket 330.

Figure 9:
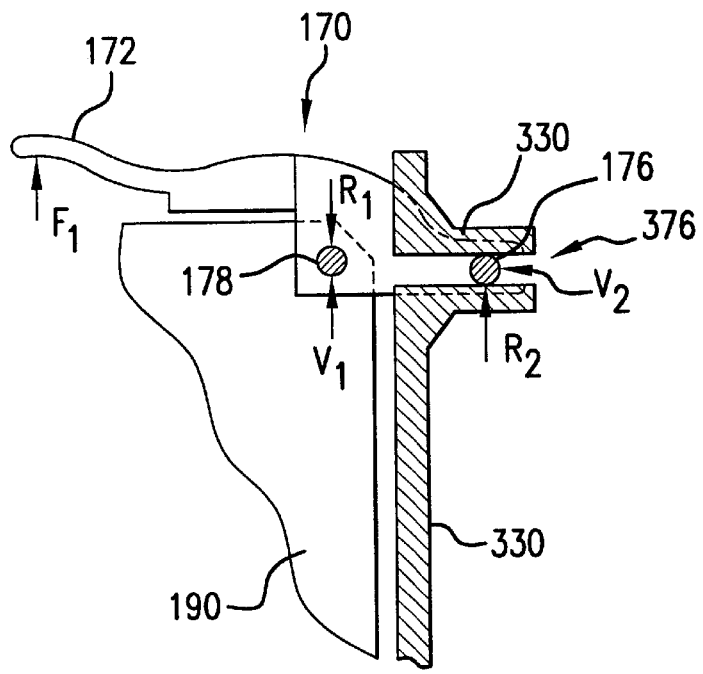
FIG. 9 is a cross-sectional view of the cam lever and bracket of FIG. 8 illustrating the movement of the cam lever with respect to the bracket when the cam lever is operated to remove a processor card from the bracket.

FIG. 9 is a cross-sectional view that illustrates the interaction of cam lever 170 and cam receiving slots 376 when the user removes processor card 190 from bracket 330. As can be understood, when the user desires to remove processor card 190 from bracket 330, the user would lift up on grasping portion 172 of cam lever 170, applying force $F_1$. The application of force $F_1$ in-turn rotates engaging tab 176 out of cam receiving slot 376 as a result of reaction forces $R_1$ and $R_2$, acting in the directions as shown, on attachment tab 178 and engaging tab 176, respectively. The application of the forces described above results in the movement of tabs 178 and 176 in directions of $V_1$ and $V_2$, respectively, relative to bracket 330. The resulting movement of cam lever 170 serves to lift processor card 190 a portion of the way out of bracket 330, and with engagement tab 176 no longer being received within cam receiving slot 376, processor card 190 may be fully removed from bracket 330.

Figure 10:
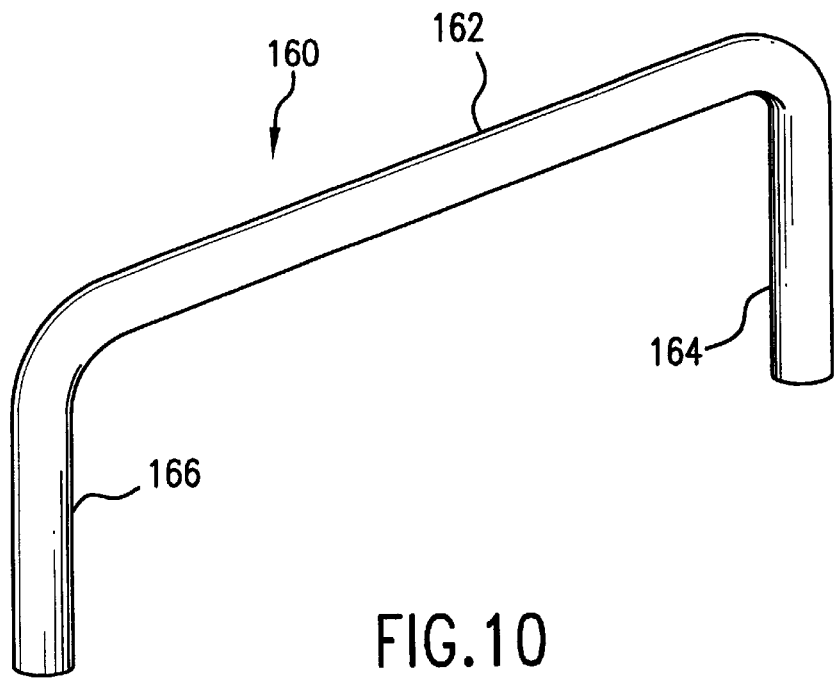
FIG. 10 illustrates an embodiment for a connecting member of the present invention.

FIG. 10 illustrates an embodiment for connecting member 160 which is utilized to connect a first processor retention module to a second dual processor retention module when two dual processor retention modules are utilized. As can be seen, connecting member 160 includes a first engagement portion 164 and a second engagement portion 166 with a connecting portion 162 extending therebetween. Referring back to FIG. 1, it can be seen that connecting member 160 is received within retention tabs 111 and retention receptacle 112 that are included on the brackets of the dual processor retention module. A second connecting member can be utilized on the opposite side of the two dual processor retention modules. The second connecting member could be formed similarly to the connecting member described above and could be received within retention tabs and retention receptacles that are included on the side opposite the side shown in FIG. 1 of the dual processor retention modules.

Figure 11:
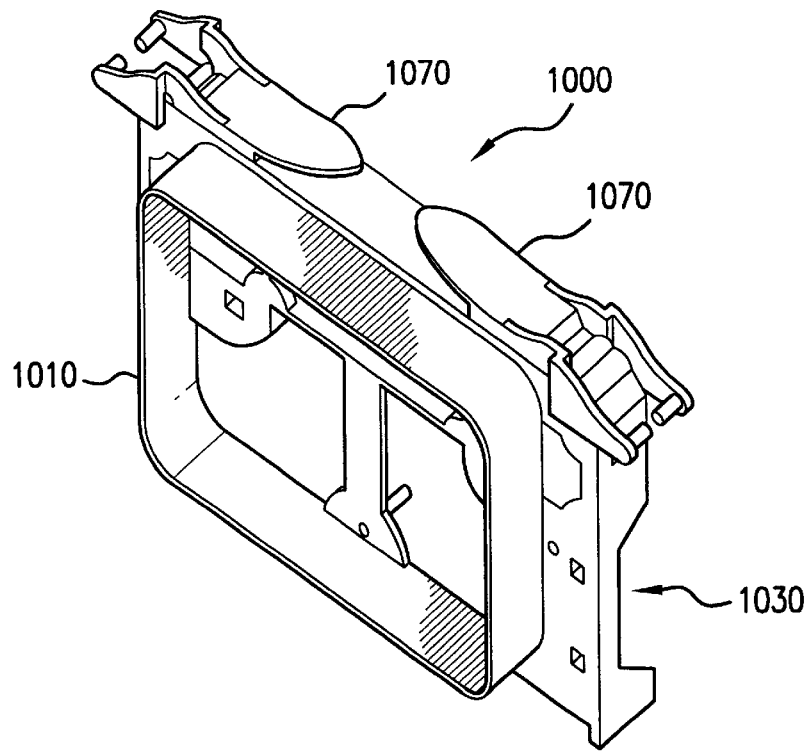
FIG. 11 illustrates an embodiment of a card replacement module that may be utilized with the present invention.

FIG. 11 illustrates a card replacement module 1000 that may be utilized when practicing the present invention. As will be further explained, card replacement module 1000 is used in place of a processor card where a dual processor retention module is utilized with less than two processor cards being installed within it. If a dual processor retention module is utilized without two processor cards installed within it, problems can occur. These problems can include an incomplete electrical circuit because a processor card is not inserted in the second electrical connector of the motherboard that extends up through the dual processor retention module. Additionally, problems with providing air flow through the dual processor retention module over the heat sink of the installed processor card can result. This problem can occur due to the disparity in the air flow paths that could exist between the brackets due to the fact that a heat sink extends from one of the brackets and the other of the brackets does not have a heat sink extending from it. Thus, the air would tend to flow nearly completely through the unobstructed path through the brackets (i.e., the path without the heat sink extending within it) and, therefore, not travel over the heat sink that extends from the other of the brackets, resulting in inefficient cooling of the heat sink.

This problem can be particularly compounded where multiple dual processor retention modules are utilized and unobstructed air paths exist between several of the brackets of the dual processor retention modules. In this circumstance, again, the air would tend to flow almost completely through the unobstructed paths between the brackets and would not flow through the paths between the brackets where there was a heat sink extending from a bracket into the path. Thus, inefficient cooling of the heat sinks for the installed processor cards could result. In order to attempt to improve the cooling of a processor card where processor cards are not installed in all brackets of a retention assembly, a card replacement module 1000 is provided.

Card replacement module 1000 is inserted within the empty bracket of a dual processor retention module where the dual processor retention module only receives a processor card in one of the two brackets. Card replacement module 1000 provides for both a complete electrical circuit for the processor assembly and a flow of air between the brackets which is similar to the air flow that results from a configuration where a processor card is installed in each bracket of the dual processor retention module.

Figure 12:
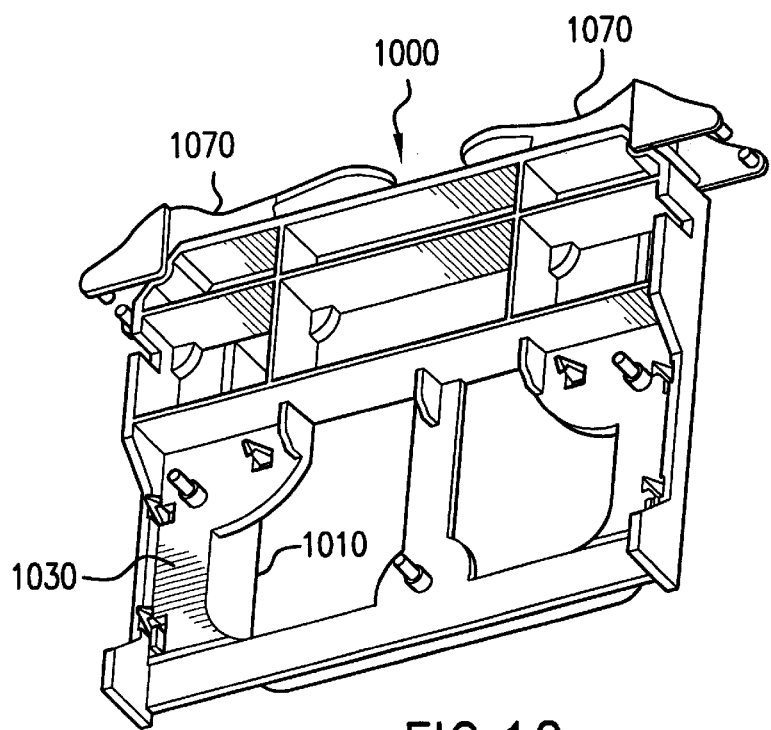
FIG. 12 illustrates an embodiment of the electrical plug structure of a card replacement module.

Card replacement module 1000 includes on a first side an electrical plug structure 1030 and on a second side an extension structure 1010. Electrical plug structure 1030 receives within it an electrical plug that is then inserted into the electrical connector on the motherboard as the card replacement module 1000 is inserted into the bracket of the dual processor retention module. On the second side of card replacement module 1000 is extension structure 1010. Extension structure 1010 extends from the structure of card replacement module 1000 such that as card replacement module 1000 is inserted into a bracket extension structure 1010 extends out of the bracket and obstructs the air flow between adjacent brackets similar to the way that a heat sink would had an actual processor card been inserted into the bracket. In this manner, extension structure 1010 simulates the structure of a heat sink that would be associated with a processor card if the processor card was inserted into the dual processor retention module. FIG. 12 provides a view of the electrical plug structure 1030 which receives within it an electrical plug as described previously. The present invention is not limited to any particular configuration for an electrical plug. The electrical plug merely completes the electrical circuit of the motherboard and processor assembly.

As can be seen in both FIGS. 11 and 12, card replacement module 1000 contains on it two cam levers 1070, the purpose and structure of which is as was described previously in this specification.

Figure 13:
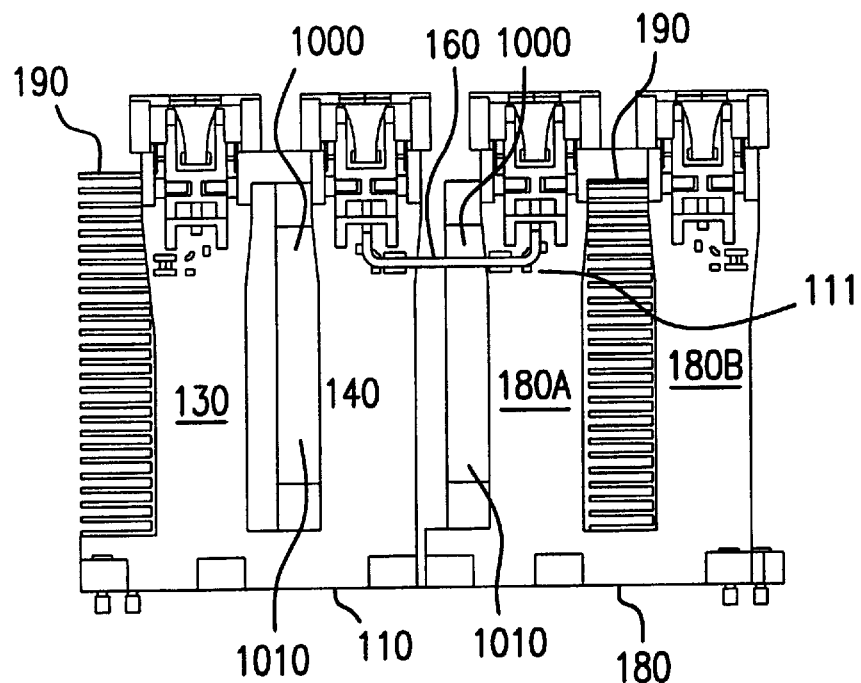
FIG. 13 illustrates an assembled configuration for two dual processor retention modules.

FIG. 13 illustrates a configuration where two dual processor retention modules are utilized and where only a single processor card is installed within each retention module. Therefore, in view of the problems that could result from this configuration, a card replacement module 1000 has been installed in the empty bracket of each retention module. As can be seen in FIG. 13, a first retention module 110 is utilized in conjunction with a second retention module 180. First retention module 110 includes first support bracket 130 and second support bracket 140. Installed within first bracket 130 is a processor card 190 and installed within second bracket 140 is a card replacement module 1000. As can be seen, the heat sink associated with processor card 190 extends outside of bracket 130. Extension structure 1010 of card replacement module 1000 extends outside of bracket 140.

As can also be seen, second retention module 180 includes first bracket 180A and second bracket 180B. Installed within second bracket 180B is a processor card 190 and installed within first bracket 180A is a card replacement module 1000. The heat sink associated with processor card 190 extends outside of bracket 180B and extension structure 1010 of card replacement module 1000 extends outside of bracket 180A. Thus, as can be seen, similar paths exist between all of the brackets such that the same volume of air is likely to pass between the brackets in order to provide sufficient air flow over the heat sinks of the installed processor cards for cooling of the processor cards. As can be understood, and as was discussed previously in this specification, if card replacement modules were not inserted within the brackets that do not contain processor cards, relatively unobstructed paths would exist between the brackets. The greatest volume of air would travel through these unobstructed paths, resulting in inadequate air flow over the heat sinks.

As was also previously explained, each card replacement module that is inserted into each bracket contains an electrical plug such that the electrical circuit on the motherboard is complete.

It should also be noted in FIG. 13 that an alternative configuration is shown for connecting member 160 and retention tabs 111, which serve to connect first retention module 110 to second retention module 180. As was described previously, a variety of different configurations for connecting member 160 and retention tabs 111 may be utilized without departing from the spirit and scope of the present invention. An additional embodiment for a connecting member will be described below with respect to FIG. 14.

As can also be seen in FIG. 13, there are only two pieces of connecting hardware included on each retention module. Thus, as can be understood, a total of only four screws, for example, can be utilized to secure the two retention modules to connecting structure on a computer chassis. Thus, the amount of connecting hardware utilized is of minimal quantity.

Figure 14:
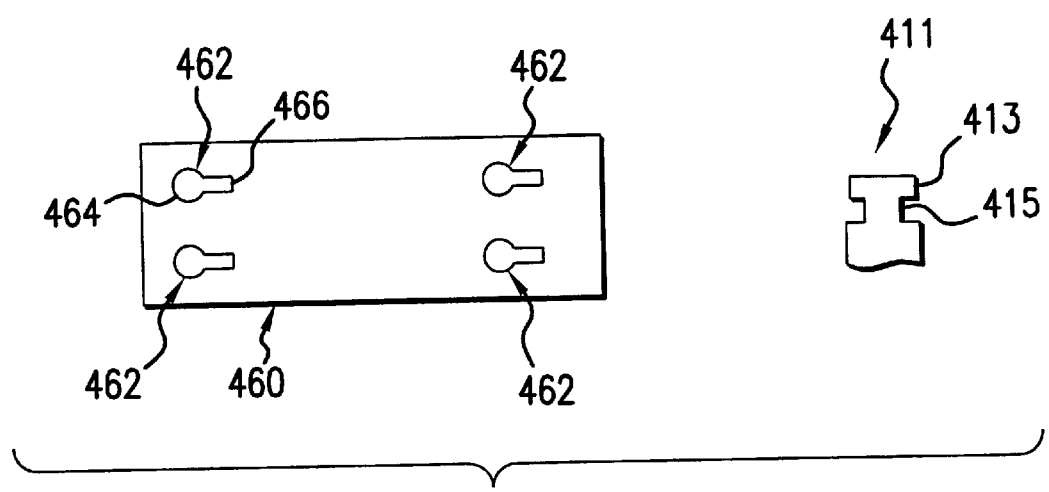
FIG. 14 illustrates an alternative embodiment for a connecting member in accordance with the present invention.

As mentioned above, a third alternative embodiment for a connecting member is illustrated in FIG. 14. As can be seen, connecting member 460 is a planar member that defines apertures 462 within it. A retention tab 411 is also illustrated in FIG. 14. At least one retention tab 411 is provided on at least one bracket of each dual processor retention module. As can be understood, apertures 462 of connecting member 460 receive within them the retention tabs 411 that are included on each dual processor retention module. The head 413 of retention tab 411 is received within the enlarged portion 464 of apertures 462 and then connecting member 460 is moved on retention tabs 411 such that shank portion 415 of each retention tab 411 is positioned within the slot portion 466 of apertures 462. Thus, connecting member 460 is mated with tabs 411 to connect a first dual processor retention module to a second dual processor retention module.

Figure 15:
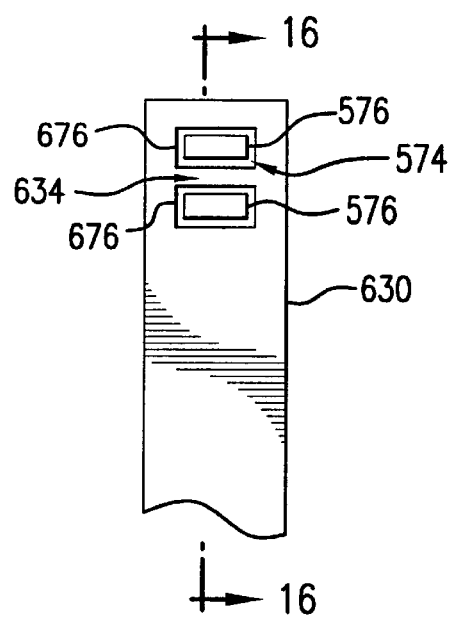
FIG. 15 illustrates an alternative embodiment in an assembled configuration for a cam lever and a bracket of a dual processor retention module.
Figure 16:
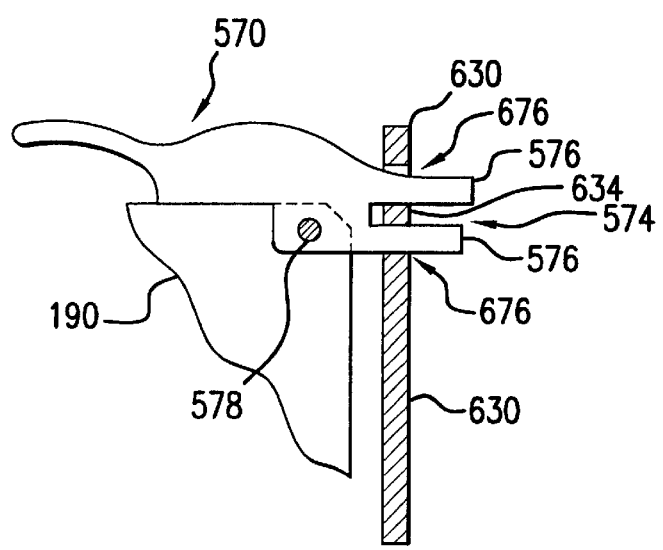
FIG. 16 is a cross-sectional view of the cam lever and bracket of FIG. 15 as taken along line 16—16 in FIG. 15.

FIGS. 15 and 16 illustrate an alternative embodiment in an assembled configuration for a cam lever and a bracket of a dual processor retention module. As can be seen in FIGS. 15 and 16, as contrasted with the embodiment of FIG. 9 for cam lever 170 and bracket 330, cam lever 570 does not contain engaging tabs (illustrated as engaging tabs 176 in FIG. 9) but rather includes two elongated, planar engagement members 576 that are disposed in a vertical plane with respect to each other and which define a slot 574 therebetween. Slot 574 receives within it engagement tab 634 that is included on each bracket 630 of a dual processor retention module. In order to position engagement tab 634 within slot 574, each engagement member 576 is received within a slot 676 that is defined in each bracket 630. Cam lever 570 includes attachment tabs 578, similar to the embodiment of FIG. 9, for attachment of cam lever 570 to a processor card 190. Thus, in the embodiment of FIGS. 15 and 16, a slot 574 defined by cam lever 570 receives within it an engagement tab 634 that is included in bracket 630. This is contrasted with the embodiment of FIG. 9 where an engagement tab on the cam lever is received within a slot that is defined by the bracket.

The dual processor retention module of the present invention may be manufactured from a variety of materials. An example of a material that could be utilized when manufacturing the retention module is Cycloy C2800, which is a polycarbonate ABS-blend plastic. The cam levers may also be manufactured from a variety of plastic materials, however, it may be desirable to include glass within the plastic material in order to increase the breaking strength of the cam levers. The connecting member may be manufactured from any of a variety of metals or plastics with the only consideration being that the connecting member be of sufficient strength to join the dual processor retention modules together and resist any forces that may be applied to the processor retention modules that could break the connection between the processor retention modules.

The disclosed embodiments are illustrative of the various ways in which the present invention may be practiced. Other embodiments can be implemented by those skilled in the art without departing from the spirit and scope of the present invention.

What is claimed is:

1. A dual processor retention module comprising:
   a base portion;
   a first bracket extending perpendicularly from said base portion;
   a second bracket extending perpendicularly from said base portion;
   a first cover hingedly attached to said first bracket; and
   a second cover hingedly attached to said second bracket;
   wherein each of said first and second covers include a securement structure at a first end thereof and a hinge structure at a second end thereof, said securement structure including:
      a shaft rotatable within said securement structure;
      a pull tab attached to said shaft; and
      a securement tab attached to said shaft and extending perpendicular to said pull tab.

2. The dual processor retention module of claim 1 wherein each of said first and second brackets includes a retention tab structure and a retention receptacle.

3. The dual processor retention module of claim 1 wherein each of said first and second brackets defines a cover slot, said cover slot receiving within it said securement tab.

4. The dual processor retention module of claim 1 wherein said hinge structure includes a hinge, said hinge being formed in a u-shaped configuration.

5. The dual processor retention module of claim 1 wherein each of said first and second brackets defines a cam receiving slot.

6. The dual processor retention module of claim 2 further comprising a connecting member having a first engagement portion, a second engagement portion, and a connecting portion extending therebetween, said connecting portion received within said retention tab structure of one of said brackets and said first engagement portion received within said retention receptacle of said one of said brackets.

7. A computer assembly comprising:
   a first dual processor retention module; having first and second cam receiving slots formed therein;
   a second dual processor retention module; having third and fourth cam receiving slots formed therein;
   a connecting member attached to said first dual processor retention module at a first end and attached to said second dual processor retention module at a second end;
   first and second processor cards, said first and second processor cards received within said first dual processor retention module; and
   third and fourth processor cards, said third and fourth processor cards received within said second dual processor retention module;
   wherein each of said processor cards includes a cam lever attached to said processor card, said cam levers operably couplable to said cam receiving slots in each of said dual processor retention modules to lock said processor cards within said dual processor retention modules.

8. The computer assembly of claim 7 wherein said cam levers include an engaging tab, said engaging tab received within said cam receiving slots.

9. The computer assembly of claim 7 wherein said dual processor retention modules include an engagement tab and wherein said cam levers define a slot, said engagement tab received within said slot.

10. The computer assembly of claim 9 wherein said slot defined by said cam levers is defined by a first elongated planar member and a second elongated planar member, said first and second elongated planar members disposed in a vertical plane with respect to each other.

11. A processor retention assembly comprising:
    a first dual processor retention module;
    a second dual processor retention module;
    a connecting member attached to said first dual processor retention module at a first end and attached to said second dual processor retention module at a second end; and
    a card replacement module, said card replacement module received with one of said dual processor retention modules and including an extension structure.

12. The processor retention assembly of claim 11 wherein said card replacement module includes a cam lever, said cam lever cooperating with a cam receiving slot defined by each of said dual processor retention modules.

13. The processor retention assembly of claim 11 wherein when said card replacement module is received within one of said dual processor retention modules said extension structure extends external to a u-shaped groove defined by said one of said dual processor retention modules.

14. The computer assembly of claim 7 further comprising:
    first and second covers, said first and second covers hingedly attached to said first dual processor retention module; and
    third and fourth covers, said third and fourth covers hingedly attached to said second dual processor retention module.

15. The computer assembly of claim 14 wherein each of said covers include a securement structure at a first end thereof and a hinge structure at a second end thereof, said securement structure including:
    a shaft rotatable within said securement structure;
    a pull tab attached to said shaft; and
    a securement tab attached to said shaft and extending perpendicular to said pull tab.

16. The computer assembly of claim 7 further comprising a second connecting member, said second connecting member attached to said first dual processor retention module at a first end and attached to said second dual processor retention module at a second end and said second connecting member disposed at an opposite end of said first and second dual processor retention modules from said first connecting member.

17. The computer assembly of claim 7 wherein said connecting member is a unshaped structure that includes a first engagement portion, a second engagement portion, and a connecting portion extending between said first and second engagement portions.

18. The computer assembly of claim 7 wherein said connecting member is a rectangularly-shaped planar structure that defines a plurality of apertures therein.

19. A computer assembly comprising:
a processor retention assembly including:
a first dual processor retention module having first and second brackets extending perpendicularly from a base portion;
a second dual processor retention module having third and fourth brackets extending perpendicularly from a second base portion;
a connecting member attached to said first dual processor retention module at a first end and attached to said second dual processor retention module at a second end; and
a motherboard, said processor retention assembly connected a minimum of once to said motherboard at each of a first end of said first dual processor retention module, a second end of said first dual processor retention module, a first end of said second dual processor retention module, and a second end of said second dual processor retention module.

20. A method for retaining a processor card assembly within a computer chassis comprising:
securing a dual processor retention module to a computer chassis, said dual processor retention module including a first bracket and a second bracket;
inserting a first processor module within said first bracket;
inserting a second processor module within said second bracket;
locking first and second cam levers into first and second cam receiving slots, respectively, said first and second cam levers included on said first and second processor modules, respectively, and said first and second cam receiving slots included in said first and second brackets, respectively.

21. The method of claim 20 further comprising:
securing a first cover over said first bracket; and
securing a second cover over said second bracket;
said first and second covers hingedly attached at a first end to said first and second brackets, respectively.

22. The method of claim 21 wherein each of said first and second covers include a securement structure at a first end thereof and a hinge structure at a second end thereof said securement structure including:
a shaft rotatable within said securement structure;
a pull tab attached to said shaft; and
a securement tab attached to said shaft and extending perpendicular to said pull tab.

23. The method of claim 20 wherein at least one of said first and second processor modules includes an extension structure, said extension structure extending external to a u-shaped groove defined by one of said brackets.

24. The method of claim 20 further comprising:
securing a second dual processor retention module to the computer chassis; and
connecting said first dual processor retention module to said second dual processor retention module, said first dual processor retention module connected to said second dual processor retention module by a u-shaped connection member.

25. A processor retention module comprising:

a base portion;

a bracket extending perpendicularly from said base portion; and a cover hingedly attached to said bracket;

wherein said cover includes a securement structure at a first end thereof and a hinge structure at a second end thereof, said securement structure including:

a shaft rotatable within said securement structure;

a pull tab attached to said shaft; and a securement tab attached to said shaft and extending perpendicular to said pull tab.

26. The processor retention module of claim 25 wherein said bracket defines a cover slot, said cover slot receiving within it said securement tab.

27. The processor retention module of claim 25 wherein said hinge structure includes a hinge, said hinge being formed in a unshaped configuration.

28. The processor retention module of claim 25 wherein said bracket defines a cam receiving slot.

29. A computer assembly comprising:

a processor retention module having a cam receiving slot defined therein;

a processor card, sad processor card received within said processor retention module; and a cover, said cover hingedly attached to said processor retention module;

wherein said processor card includes a cam lever attached to said processor card, said cam lever operably couplable to said cam receiving slot to lock said processor card within said processor retention module, and said cover includes a securement structure at a first end thereof and a hinge structure at a second end thereof, said securement structure including:

a shaft rotatable within said securement structure;

a pull tab attached to said shaft; and a securement tab attached to said shaft and extending perpendicular to said pull tab.

30. The computer assembly of claim 29 wherein said cam lever includes an engaging tab, said engaging tab received within said cam receiving slot.

31. The computer assembly of claim 29 wherein said processor retention module includes an engagement tab and wherein said cam lever defines a slot, said engagement tab received within said slot.

32. The computer assembly of claim 31 wherein said slot defined by said cam lever is defined by a first elongated planar member and a second elongated planar member, said first and second elongated planar members disposed in a vertical plane with respect to each other.

33. A method for retaining a processor card assembly within a computer chassis comprising:

securing a processor retention module to a computer chassis, said processor retention module including a bracket;

inserting a processor module within said bracket;

locking a cam lever into said bracket, said cam lever included on said process or module; and securing a cover over said bracket, said cover hingedly attached to said bracket;

wherein said cover includes a securement structure at a first end thereof and a hinge structure at a second end thereof, said securement structure including:

a shaft rotatable within said securement structure;

a pull tab attached to said shaft; and a securement tab attached to said shaft and extending perpendicular to said pull tab.

\* \* \* \* \*

UNITED STATES PATENT AND TRADEMARK OFFICE
CERTIFICATE OF CORRECTION

PATENT NO.     : 6,381,148 B1                                           Page 1 of 1
DATED          : April 30, 2002
INVENTOR(S)    : George Daskalakis et al.

It is certified that error appears in the above-identified patent and that said Letters Patent is hereby corrected as shown below:

Column 2,
Line 65, change "tat" to -- at --.

Column 3,
Line 17, change "releasable" to -- releasably --.

Column 11,
Line 6, change "unshaped" to -- u-shaped --.

Column 12,
Line 24, change "unshaped" to -- u-shaped --.
Line 31, change "sad" to -- said --.

Signed and Sealed this

Twenty-second Day of April, 2003

JAMES E. ROGAN
*Director of the United States Patent and Trademark Office*